United States Patent [19]

Yagusic et al.

[11] 4,115,838

[45] Sep. 19, 1978

[54] PACKAGING OF A SEMICONDUCTOR

[75] Inventors: George J. Yagusic, Litchfield; Richard A. Boronosky, Thomaston, both of Conn.

[73] Assignee: General Time Corporation, Thomaston, Conn.

[21] Appl. No.: 715,001

[22] Filed: Aug. 17, 1976

[51] Int. Cl.² .............................................. H05K 5/06
[52] U.S. Cl. .................................. 361/388; 174/52 PE
[58] Field of Search ............... 361/388, 389, 380, 386; 174/52 PE, 16 HS

[56]     References Cited
         U.S. PATENT DOCUMENTS

| 3,201,655 | 8/1965 | Bradt et al. ................ | 174/52 PE X |
| 3,439,255 | 4/1969 | Carnes et al. ................ | 361/388 X |
| 3,638,073 | 1/1972 | Bernstein ................ | 361/389 X |
| 3,748,538 | 7/1973 | Shekerjian et al. ............ | 174/52 PE |
| 3,801,728 | 4/1974 | Gallo, Jr. et al. ............... | 361/388 X |

Primary Examiner—R. N. Envall, Jr.
Attorney, Agent, or Firm—Pennie & Edmonds

[57]               ABSTRACT

A solid state electrical component is packaged within a housing and after connection to a terminal board is potted by an encapsulating medium. The solid state electrical component includes a chip area and a plurality of terminals connected to the chip. These terminals are connected to a terminal board which provides support for additional terminal members which extend from the housing and adapted for connection in an electrical circuit. The housing and device are supported by a frame serving as a heat sink.

4 Claims, 4 Drawing Figures

PACKAGING OF A SEMICONDUCTOR

BACKGROUND OF THE INVENTION

The present invention relates to the means and manner of packaging a solid state electrical component whereby it not only is protected against damage in normal handling such as during connection in an electrical circuit, but also may be readily connected in the same.

At the present time, solid state electrical components are supplied by the various manufacturers in a packaged form for mounting on or adjacent to printed circuit boards for connection in the electrical circuit which it may carry. One such device, generally referred to as an isolated stud mounted Triac, includes a cylindrical body having an enlarged base with an undercut lower round length. The body supports the Triac and the terminals are encapsulated by a glass insulation. The terminals are adapted for connection in an electrical circuit by soldering leads thereto and the device is mounted by passing the lower length through an opening in the printed circuit board or adjacent mounting. The lower length is threaded and a nut is threadedly received to bind the base against the printed circuit board or bracket.

BRIEF DESCRIPTION OF THE INVENTION

The present invention is an improvement over the prior art relating to packaged solid state electrical components and the manner of their packaging. In particular, although the present invention has greater applicability, the present invention is an improvement over the described prior art. Solid state devices of various type are common in all forms of equipment and apparatus in today's marketplace. Some of these devices lend themselves to be packaged and it is an object of the present invention to provide such a packaged device which for various reasons will find ready acceptability. Not the least of these reasons is the superior reliability of the product over the period of use because of the ruggedness of the package. Acceptability also from the facility of connection of the solid state component in an electrical circuit. Further, the solid state device may be packaged more cheaply than those of the prior art and may be mounted in less time and at reduced expense.

Other objects and advantages of the present invention will become clear as the specification continues.

DESCRIPTION OF THE PREFERRED EMBODIMENT

The present invention is directed both to the packaging of an electrical component such as a solid state electrical component and to the manner of packaging the same whereby the several advantages as have been referred to are found to accrue. While many types of electrical components are capable of packaging in accordance with the present invention, the following discussion will be directed to the packaging of a thyristor including but not limited to silicon-controlled rectifiers (SCR) and Triacs, the latter as manufactured by the Unitrode Corporation, Watertown, Mass. The packaged electrical component hereinafter is simply referred to as "the package."

Generally, the package comprises a housing received substantially around the device supported by a heat sink and a terminal board received within the housing which provides a supporting surface for a plurality of terminals to which the terminals of the device are connected. This structure now to be more particularly described, may be seen to advantage in FIG. 1.

As illustrated, the device 12 is supported by a mounting flange 14 which, in turn, is supported by a frame 16. The frame comprises base means for a housing to be described hereafter. Both the mounting flange and frame are formed of a material providing characteristics of good conduction of heat thereby to act as a heat sink. An important criteria is that heat be conducted from the mounting flange so that its temperature does not exceed 65° C. Thus, the mounting flange and the frame may be formed of aluminum, coppper or steel to name three materials which may be used. Aluminum is preferred because of cost considerations. Heat dissipation during operation will be enhanced if the heat sink has a large surface area.

The device may be supplied either with flexible leads or semirigid terminals 18 connecting at one end (not shown) to the semiconductor layers in the chip area of the device. In the figure the chip area is coated at 20 with a layer of silicone. The silicone has inherent flexibility thereby to provide mechanical protection of the chip area.

The particulars of the make-up of the device, except as specifically described, are not within the scope of the present invention which is directed to the manner and means by which it is packaged. For the present discussion the device will be considered conventional.

Figures 1, 2, 3:
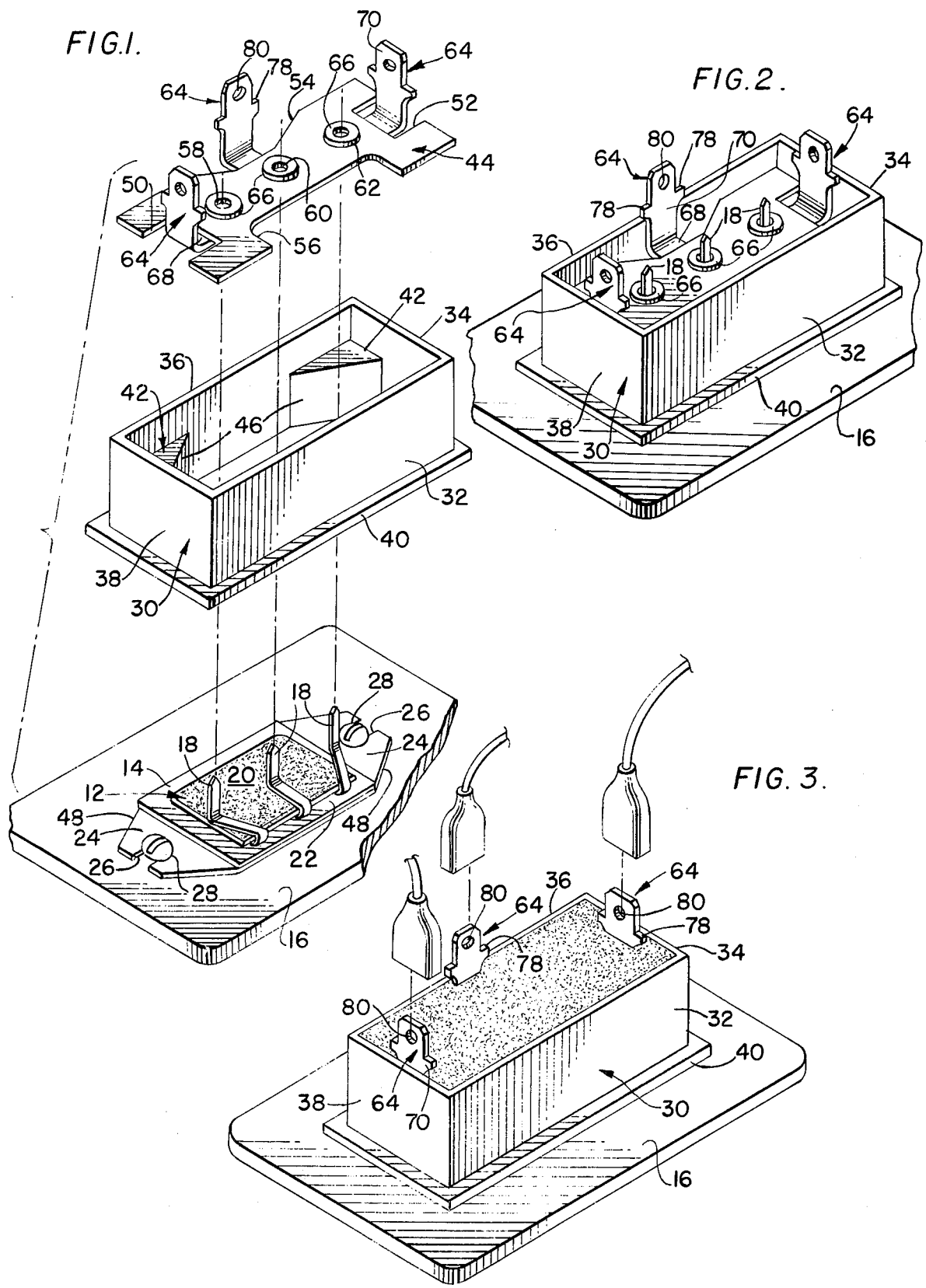
FIG. 1 is a view in perspective of the components of the present invention exploded away from a housing in which they are packaged.
FIG. 2 is a view similar to FIG. 1 of the components in assembled orientation.
FIG. 3 is a view similar to FIG. 2 following a potting operation.

The mounting flange 14 may be a laminated structure including a top lamina of an outline substantially conforming to the outline of the device which it supports and a bottom lamina ("top" and "bottom" refer to the orientation as illustrated in FIG. 1) having a pair of ears 24 which extend from a central region of an outline like that of the top lamina. As illustrated, the central region 22 is rectangular in outline and the ears which extend from the bottom lamina are tapered toward the ends. A slot 26 is formed in the end of each ear. A machine screw 28 whose shank portion is received within the slot and threaded into the frame may provide securement for the mounting flange. Securement of the lamina and of the device to the top lamina may be carried out by any means as is customary in the art.

A housing 30 is received around the mounting flange and supported by the surface of the frame. The housing includes a plurality of walls 32, 34, 36 and 38, which in horizontal section define a rectangular frame. Preferably, the housing is of a plastic material which may be suitably molded by techniques that are known. The material should be one which provides in the molded unit ruggedness, high impact strength, good supporting stability, and among other features which may be apparent or necessary with the function of the housing in mind should be flame retardant. Materials which may be used include polycarbonates, i.e., LEXAN (a tradename of the General Electric Company), an acrylic plastic, such as acrylonitrilebutadiene-styrene, polyvinyl chloride, and others. The housing exterior at the base of the walls may include therearound a rim 40 to provide additional surface area for contact with the frame 16. A plurality of shoulders 42 are disposed within the housing preferably integrally with the walls at the four corners. The upper surface of the shoulders support a terminal board 44, as will be discussed. The shoulders are triangular in outline including a long side 46 which is of a length and disposed at an angle conforming to for support of the tapered side 48 of each of the ears 24 thereagainst.

The terminal board 44 is received within the housing 30 and supported on the surface of shoulders 42. The terminal board, likewise, is generally rectangular in outline, having a major and minor dimension slightly less than that of the interior dimension of the housing. In this manner the terminal board may be received within the housing by a relatively tight fit yet received without binding.

Within the general rectangular outline the terminal board is irregularly configured to provide in opposite ends rectangular slots 50 and 52 and a trapezoidal cutout 54 along one side. The other side includes an elongated cutout 56. A plurality of openings 58, 60 and 62 are formed within and substantially along the axis of the body of the terminal board thereby to be closely spaced to the respective cutouts and slots. A terminal 64 is disposed in each slot and one of the cutouts in a three terminal device. Either cutout may be selected. A Stimpson-type eyelet 66, a type of securement which is well-known, may be employed in mounting the terminals.

Each terminal includes a base 68 which is received under the terminal board and an arm 70 which extends generally upwardly from the respective cutout or slot for purposes as will be set out. The base of the terminals includes an opening (not shown) of substantially the same diameter as the openings 58, 60 and 62 in the terminal board 44.

The terminal board is formed of an electrically non-conductive and heat resistant material such as a paper reinforced phenolic board. The terminal board will have a thickness such that when supported by the shoulders its upper surface will be disposed below the plane at the top of walls 32 . . . 38 (see FIG. 2). Further, the material should be of a standard NEMA grade of XP or better. The terminals 64 and eyelets 66 formed of an electrically conductive material such as copper, brass or the equivalent.

In the assembly of the structure described, the housing 30 is received on the frame 16 around the mounting flange 14. These structures will have been assembled, as described, and the terminals 18 will have been bent so that their ends are disposed generally coaxially of the openings 58, 60 and 62. The terminals may be about 0.5 inches long thereby to extend through the openings when the terminal board is received within the housing.

The terminal board 44, next, is received within the housing and the ends of the terminals 18 are soldered to the eyelets 66 thereby to connect the device 12 to terminals 64. Since the mounting flange 14 is secured to frame 16, the housing 20 and terminal board 44 likewise will be secured to the frame once the solder connection as described is effected. The mounted structure is illustrated in FIG. 2.

Thereafter, the terminal board 44 and device 12 is potted within the housing 30, see FIG. 3, with the result that only the ends of terminals 64 extend from within the housing. The material used for potting or encapsulation may be a general purpose epoxy having characteristics of good insulation, mechanical stability, and flame retardant. Such materials are well known and conventionally employed for this purpose. An epoxy such as Type 2651 MM-FR (4/75) sold by Emerson & Cumming, Inc. has been used successfully.

Figure 4:
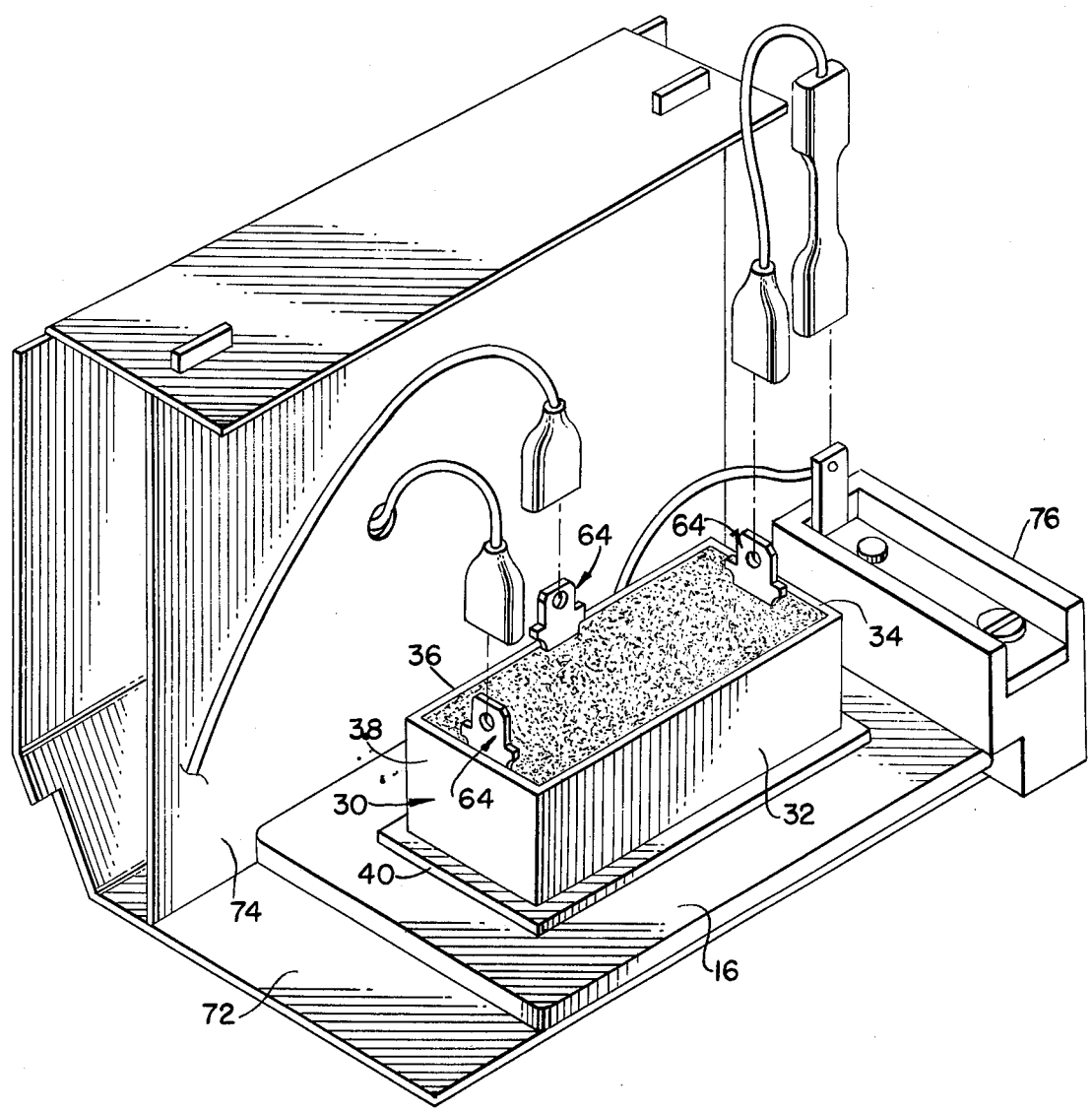
FIG. 4 is a view similar to FIG. 3 of the packaged components mounted on a supporting structure.

FIG. 4 illustrates the packaged device having been mounted on a bracket 72, which also supports a printed circuit board 74 and a terminal block 76. Connection of the device 12 into an electrical circuit may be by means of a connector or clip slidably received over the ends of each terminal 64 or by means of a solder connection. For these purposes, the arms 70 of the terminals 64 are shaped like a blade including a pair of shoulders 78 which limit receipt of the connector or clip as well as an opening 80 for receipt of the end of the wire. The packaged device may be mounted riveting or otherwise attaching the frame 16 to the bracket 72 and the electrical connections may be made.

Having described the invention with particular reference to the preferred form thereof, it will be obvious to those skilled in the art to which the invention pertains after understanding the invention, that various changes and modifications may be made therein without departing from the spirit and scope of the invention as defined by the claims appended hereto.

What is claimed is:

1. A package for an electrical component comprising:
   (a) a housing having side wall means and opposite open ends adapted to telescope around said electrical component;
   (b) base means providing a surface upon which each said electrical component and said housing are mounted;
   (c) a terminal board, said terminal board being formed of a non-conductive material and including a plurality of openings in spaced-apart relation;
   (d) a first plurality of terminals;
   (e) conductive eyelet means mounting one end of each of said first plurality of terminals, said conductive eyelet means received through respective openings in said terminal board whereby each of said first plurality of terminals is insulated from the others;
   (f) means mounting said terminal board within said housing so that the other end of said terminals extend outwardly from said housing;
   (g) said electrical component including a second plurality of terminals, each terminal of said second plurality of terminals received through and electrically connected to one of said conductive eyelet means; and,
   (h) means encapsulating said terminal board and electrical component within said housing.

2. The package of claim 1 wherein said base means providing a mounting surface is formed by a metallic plate comprising a heat sink.

3. The package of claim 1 wherein said terminal board mounting means is formed by a shoulder disposed at intervals around said wall means, said shoulders providing a mounting surface for said terminal board.

4. The package of claim 3 wherein said housing is formed of a non-conductive material.

* * * * *